United States Patent
Mimura et al.

[19]

[11] Patent Number: 6,147,295
[45] Date of Patent: *Nov. 14, 2000

[54] SUNLIGHT ENERGY CONVERSION APPARATUS, AND AIR CIRCULATION SYSTEM

[75] Inventors: Toshihiko Mimura; Kimitoshi Fukae, both of Nara; Masahiro Mori, Kyoto; Takeshi Takada, Kyoto; Satoru Shiomi, Kyoto, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/794,166
[22] Filed: Feb. 3, 1997

[30] Foreign Application Priority Data

Feb. 7, 1996 [JP] Japan ................................ 8-044036

[51] Int. Cl.[7] .................................................. H01L 25/00
[52] U.S. Cl. ........................... 136/246; 454/242; 454/250
[58] Field of Search ........................... 136/246; 454/242, 454/250

[56] References Cited

U.S. PATENT DOCUMENTS

| | | | |
|---|---|---|---|
| 4,056,405 | 11/1977 | Varadi | 136/89 PC |
| 4,080,221 | 3/1978 | Manelas | 136/89 PC |
| 4,186,033 | 1/1980 | Boling et al. | 136/89 FC |
| 4,544,798 | 10/1985 | Cannella | 136/251 |
| 4,555,586 | 11/1985 | Guha et al. | 136/259 |
| 5,589,006 | 12/1996 | Itoyama et al. | 136/248 |

FOREIGN PATENT DOCUMENTS

| | | | |
|---|---|---|---|
| 4339547 | 5/1995 | Germany | H01L 31/052 |
| 3-48299 | 7/1991 | Japan | E04B 1/74 |
| 4-343481 | 11/1992 | Japan . | |
| 7-58799 | 6/1995 | Japan | 136/251 |
| 7-280358 | 10/1995 | Japan . | |
| 7-120811 | 12/1995 | Japan . | |

OTHER PUBLICATIONS

Patent Abstracts of Japan, vol. 011, No. 048 (M–561) Feb. 1987.
Patent Abstracts of Japan, vol. 008, No. 166 (M–314) Aug. 1984.
Patents Abstracts of Japan, vol. 096, No. 002, Feb. 1966.
Patents Abstracts of Japan, vol. 008, No. 005, (M–267) Jan. 1987.

*Primary Examiner*—Mark Chapman
*Attorney, Agent, or Firm*—Fitzpatrick, Cella, Harper & Scinto

[57] ABSTRACT

A sunlight energy conversion apparatus comprises a photoelectric transducer comprising a non-single crystal semiconductor and means for supplying heat to the photoelectric transducer through a flowing heating medium.

40 Claims, 7 Drawing Sheets

SUNLIGHT ENERGY CONVERSION APPARATUS, AND AIR CIRCULATION SYSTEM

BACKGROUND OF THE INVENTION

1. Field of the Invention

This invention relates to a sunlight energy conversion apparatus comprising a heat collector panel with a solar cell, and to a house air circulation system making use of the same. It also relates to a method of controlling the temperature of the photoelectric transducer.

2. Related Background Art

What is called Staebler-Wronski effect is known in the art as a phenomenon in which photoelectric transducers such as solar cells making use of non-single crystal semiconductors cause a decrease in conversion efficiency with time when exposed to light. For its control, it is known to be effective to keep the device hot or heated.

Figure 10:
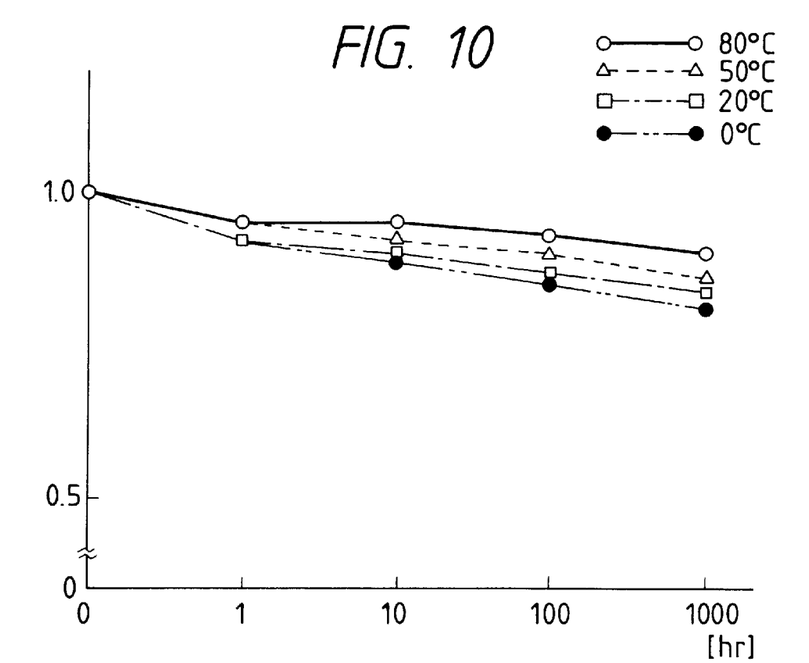
FIG. 10 shows temperature dependence of the deterioration of photoelectric transducers exposed to light.

The present inventors made an experiment to obtain the results as shown in FIG. 10. FIG. 10 shows how the conversion efficiency changes with time when solar cell modules are respectively kept at 0°C., 20° C., 50° C. and 80° C. As is seen therefrom, the conversion efficiency deteriorates at a lower degree as the solar cells are kept heated at a higher temperature and also for a longer time.

Besides such data, Japanese Patent Publication No. 7-58799 discloses that photoelectric transducers can be prevented from their deterioration due to exposure to light, by enclosing the photoelectric transducers with heat insulation materials so that the service environmental temperature of the devices can be made higher than the outdoor temperature.

Japanese Patent Publication No. 7-120811 discloses that a protective film incorporated with a black pigment is provided on the back of a solar cell formed of amorphous silicon, whereby the device can be kept at a higher temperature to prevent its deterioration.

However, an attempt to rely on only a heat insulation material to maintain a higher temperature than the outdoor temperature for a long time results in a very high cost for the heat insulation material. Also, though the ground radiates heat at night, this heat can not be utilized for keeping the device hot. The present inventors examined the effect of structures kept hot using heat insulation materials and obtained the results as shown in Table 1. A device enclosed with a 50 mm thick polystyrene sheet used as a heat insulation material and another device not enclosed with a heat insulation material were tested to examine their changes in temperature in one day. As is seen from the results, the temperature rather becomes lower at dawn than the outdoor temperature even in the case of the device enclosed with a heat insulation material. This is presumed to be due to the fact that the devices can not receive the heat radiated from the ground at night. An attempt to maintain the daytime high temperature may require use of heat insulation materials in a large quantity.

Even with use of the protective film incorporated with a black pigment, the device can not be kept at well high temperature.

Meanwhile, Japanese Patent Publication No. 3-48299 discloses a "passive solar system house", where air heated by solar heat is taken from a space between a roof and a ceiling into a room through a duct and its heat is stored in a concrete slab provided underground so that the room can be efficiently warmed.

Such an air circulation system is opportune because recycled energy is utilized, but its fan used to circulate the air requires external power supply.

SUMMARY OF THE INVENTION

To solve the above problems, the present invention provides a sunlight energy conversion apparatus comprising a photoelectric transducer comprising a non-single crystal semiconductor and means for supplying heat to the photoelectric transducer through a flowing heating medium. The apparatus thus constituted enables easy temperature control of the photoelectric transducer. In particular, it can prevent a lowering of temperature of the transducer and also prevent its deterioration by light.

The present invention also provides an air circulation system comprising a heat collector panel comprising an open-air intake, an indoor-air intake, a valve for selecting either the open-air intake or the indoor-air intake, an air flow path, an air outlet, and a solar cell, a first duct through which the air taken out of the air outlet is guided indoors, a second duct through which the air taken out of the air outlet is discharged outdoors, a valve for selecting either the first duct or the second duct, and a fan for allowing the air taken through the air outlet to flow, wherein the fan is supplied with electric power generated by the solar cell. Thus, an air circulation system that can be self-driven can be provided. This air circulation system can prevent photodeterioration of the solar cell and can utilize heat of sunlight.

The present invention still also provides a method of controlling the temperature of a photoelectric transducer, which comprises allowing air to flow through an air flow path provided on the back of the photoelectric transducer comprising a non-single crystal semiconductor, thereby controlling the temperature of the photoelectric transducer.

DESCRIPTION OF THE PREFERRED EMBODIMENTS

As specific means, the present invention basically includes the following (a) and (b).

(a) A sunlight energy conversion apparatus used as a roof material is made to have a higher thermal resistance with respect to open air and is interposed between a roof material conventionally used and a heat insulation material provided between the roof material and the interior of a room to thereby make up a heat insulation structure. More specifically, the heat insulation material is conventionally used on the back of a roof material, where heat insulation properties can be imparted by only making the photoelectric transducer have a higher thermal resistance on its light-incident side. Making up the structure in this way, the cost of heat insulation materials that has been questioned when conventional heat insulation structures are formed can be effectively reduced as the whole system.

(b) A structural material of the above sunlight energy conversion apparatus is provided with an open-close controllable hole that communicates with space (chiefly the room) having a large heat capacity. At night during which the temperature of the apparatus drops, the hole is kept open so that the apparatus may thermally combine with warm space to thereby prevent a lowering of temperature of the photoelectric transducer. More specifically, the sunlight energy conversion apparatus conventionally used as a roof material of a house has beneath it a room having a large heat capacity and kept warm at night, and may more cause a lowering of temperature when it has a heat insulation material than when it has no heat insulation material, resulting in an acceleration of the deterioration due to exposure to light, which corresponds to the instance where the apparatus making use of a heat insulation material has a lower temperature at dawn or at night as reported in the test results shown in Table 1. In the present invention, a means that can solve this problem and makes the apparatus thermally combine with the interior of a room at night is provided to thereby maintain the photoelectric transducer at a higher temperature, so that the deterioration due to exposure to light can be effectively prevented.

The present invention will be described below by giving specific embodiments.

As a first embodiment of the present invention, the most basic constitution will be first described in which the apparatus of the present invention is applied in a conventional roof material. In the present embodiment, the apparatus is intended to be provided in a roof. Needless to say, it may be applied to a wall.

Figure 1:
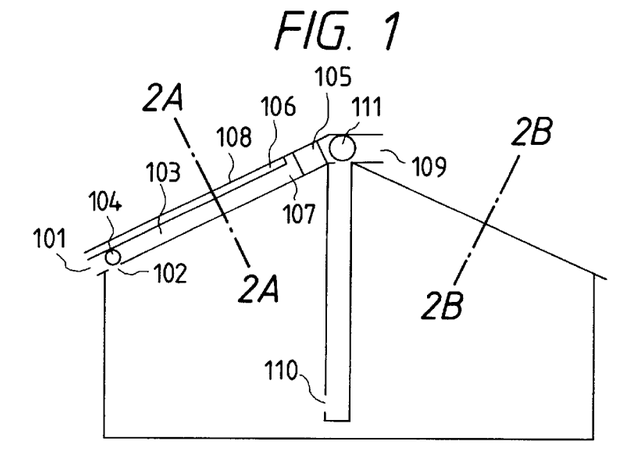
FIG. 1 illustrates an air circulation system according to the present invention.
Figure 2A:
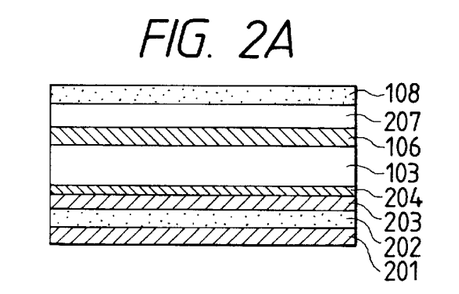
FIGS. 2A and 2B show cross sections along the lines 2A—2A and 2B—2B in FIG. 1.
Figure 2B:
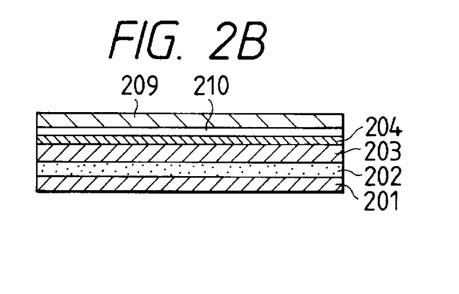

The whole schematic view of the present embodiment is shown in FIG. 1, and details of layer configuration of the roof are shown in FIGS. 2A and 2B.

A house having a roof provided with the sunlight energy conversion apparatus according to the present invention is constituted chiefly of an open-air intake 101, an indoor-air intake 102 for taking the air from the room, an air flow path 103, a valve 104 for selecting the air to be flowed into the air flow path, a fan 105 for producing the convection of air, a photoelectric transducer 106, an air flow outlet 107 for taking the air from the air flow path, a glass plate 108 for making heat insulation to the open air, an air discharge outlet 109 for discharging the air to the open air, an indoor air blow outlet 110, and a valve 111 for selecting the air discharge outlet 109.

FIGS. 2A and 2B show cross sections along the lines 2A—2A and 2B—2B in FIG. 1. The roof material having the sunlight energy conversion apparatus of the present invention is constituted chiefly of a frame material 201, a heat insulation material 202, a frame material 203, a waterproof sheet 204, the air flow path 103, the photoelectric transducer 106, a heat insulation air layer 207, and the glass plate 108. For reference, a structure of a conventional metallic roof is shown in FIG. 2B as a cross section along the line 2B—2B, where reference numeral 209 denotes a conventional metallic roof made of a galvanized sheet iron or the like, and 210, a gap formed when the roof is provided.

How to Drive

Figure 3A:
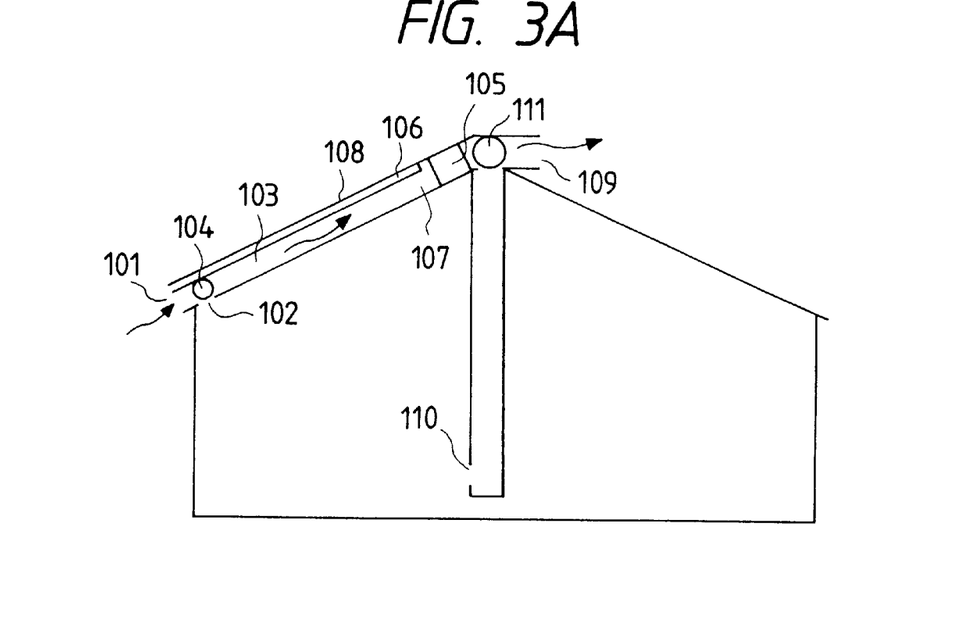
FIG. 3A illustrates how the air is circulated through the air circulation system of the present invention in the daytime in summer.
Figure 3B:
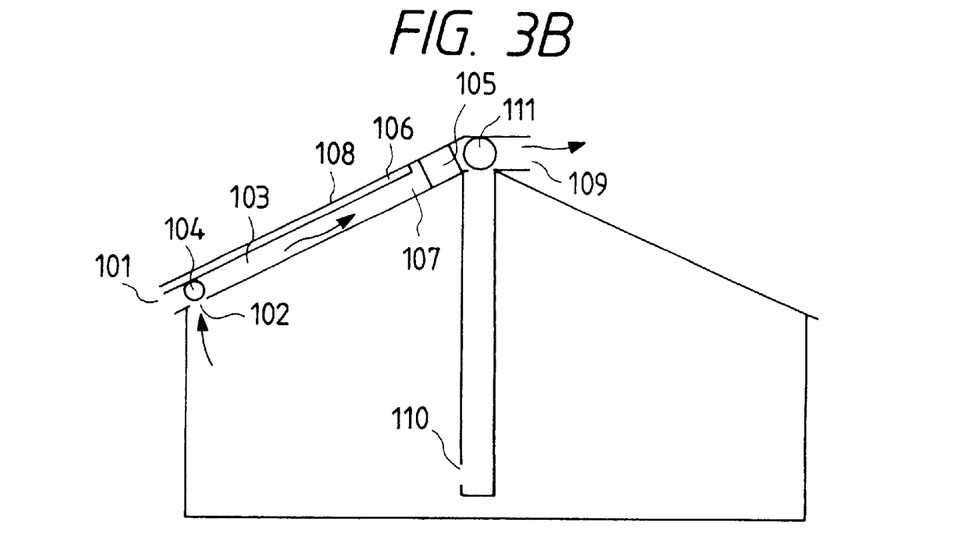
FIG. 3B illustrates how the air is circulated through the air circulation system of the present invention at night in summer.

FIGS. 3A and 3B illustrate courses through which the air flows in the present invention when the amount of solar radiation is large in summer. FIG. 3A illustrates a course in the daytime, and FIG. 3B a course at night. In the daytime in summer, heat much overwhelming the deterioration preventive effect of the photoelectric transducer is imparted to the transducer, and hence fillers and wiring members may be adversely affected. Accordingly, the open air having entered through the open-air intake 101 provided at the eaves is allowed to flow toward the ridge of the roof through the air flow path 103 formed between the waterproof sheet 204 and the photoelectric transducer 106. In that course, the air cools the photoelectric transducer 106 having come to have a high temperature by sunshine, passes through the fan 105 and is discharged out through the air discharge outlet 109. The system driven in this way makes it possible to make constituent members less adversely affected by heat while maintaining the temperature sufficient for preventing deterioration by light. The air layer flowing beneath the roof also functions as a heat insulation material that separates the heat of the roof material from the room, so that the room cooling efficiency can be improved.

Meanwhile, when the amount of solar radiation is small in summer, e.g., at night, the valve 104 is switched to the indoor side so that the air in the room is allowed to flow into the air flow path 103 through the air intake 102, whereby the photoelectric transducer 106 can be prevented from undergoing radiant cooling and also the heat filling the room can be discharged outside.

Figure 4A:
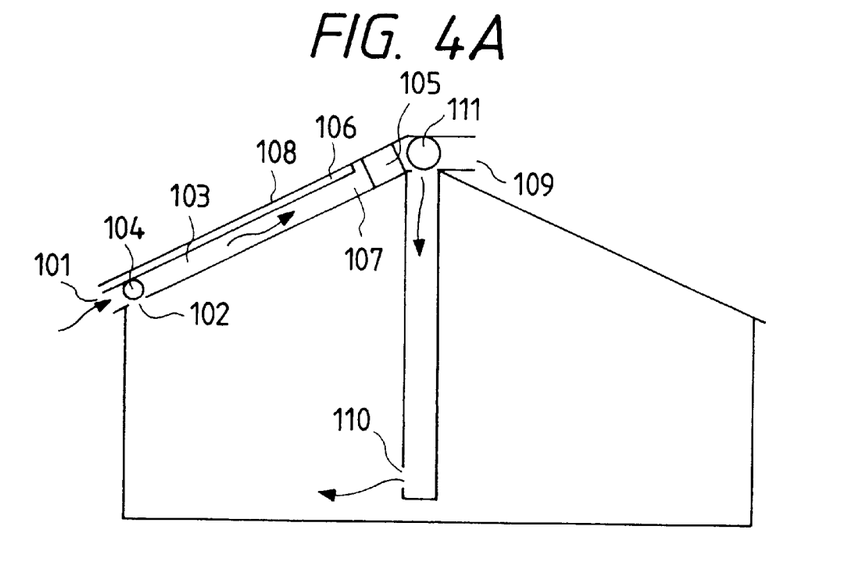
FIG. 4A illustrates how the air is circulated through the air circulation system of the present invention in the daytime in winter.
Figure 4B:
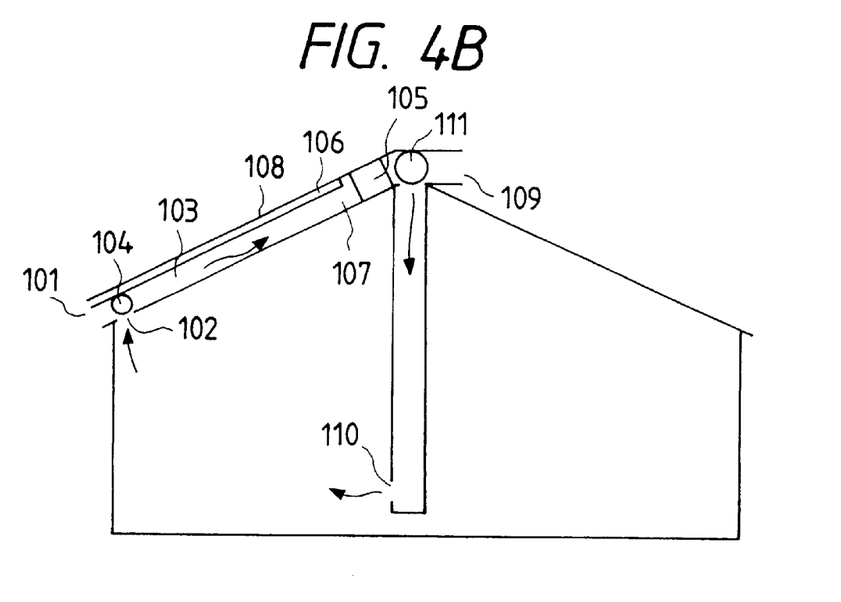
FIG. 4B illustrates how the air is circulated through the air circulation system of the present invention at night in winter.

FIGS. 4A and 4B illustrate courses through which the air flows in the present invention when the amount of solar radiation is large in winter. FIG. 4A illustrates a course in the daytime, and FIG. 4B a course at night. In the daytime in winter, the open air having entered through the open-air intake 101 provided at the eaves is allowed to slowly flow toward the ridge of the roof through the air flow path 103 formed between the waterproof sheet 204 and the photoelectric transducer 106. In that course, the air cools the photoelectric transducer having come to have a high temperature by sunshine, and the air itself is heated to come to have a higher temperature. The air thus heated is drawn into the the interior of a house through the indoor air blow outlet 110 by means of the fan 105 to be utilized for warming the room.

Incidentally, the temperature in the interior of a house can be adjusted by controlling the throttling of the valve 111.

Meanwhile, when the amount of solar radiation is small in winter, e.g., at night, the valve 104 is switched to the indoor-air intake 102 side and the valve 111 is completely switched to the indoor side so that the hot air blown out of the indoor air blow outlet 110 is circulated indoors, whereby the hot air in the room can be utilized for heating the photoelectric transducer 106 and also the hot air that may localize in the room can be refluxed to make air heating effectively utilizable.

System With Heat Storage Member

As a second embodiment of the present invention, a system having a heat storage member will be described below. The present embodiment is an example in which the present invention is applied to passive solar system housing.

Figure 6A:
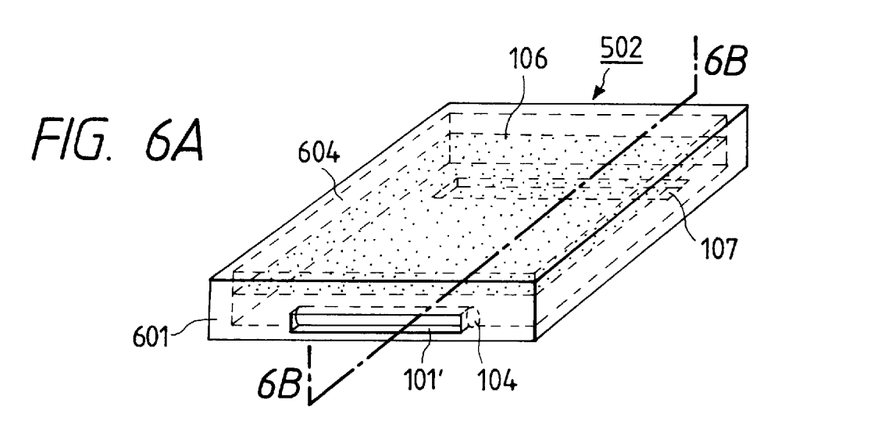
FIGS. 6A and 6B are a perspective view and a cross section, respectively, illustrating a heat collector panel according to the present invention.
Figure 6B:
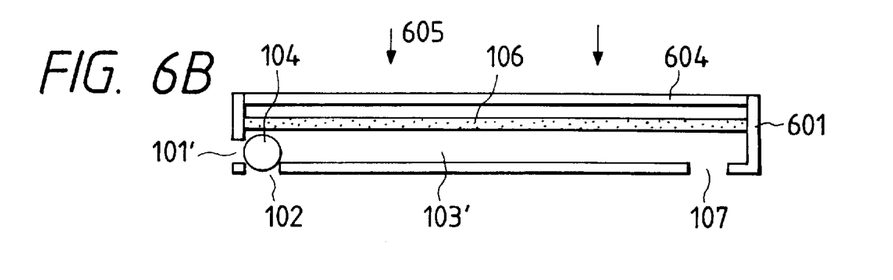
Figure 7A:
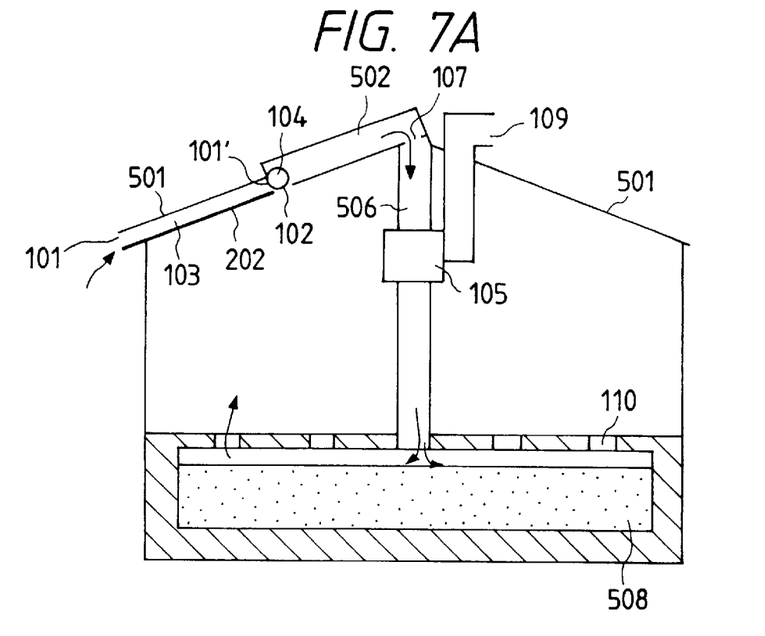
FIG. 7A illustrates how the air is circulated through the air circulation system of the present invention in the daytime in winter.

The whole schematic view of the present embodiment is shown in FIG. 7A, and details of a heat collector panel is shown in FIG. 6.

In the present embodiment, the system ensures as solar heat collecting zones an air flow path 103 held between a roof material 501 and a heat insulation material 202 and space inside a heat collector panel 502 serving as the sunlight energy conversion apparatus. The system is additionally constituted of an open-air intake 101 provided at the eaves as an intake of the air that serves as a heating medium, a duct 506 and a fan 105 which are provided to draw hot air into the interior of a house, and concrete 508 in which the heat is accumulated and stored, a indoor air blow outlet 110 for taking hot air into the room, and a valve 104 for selecting the air to be taken into the heat collector panel. The fan 105 is internally provided with a valve for switching the air to flow indoors or outdoors.

FIGS. 6A and 6B are a perspective view and a cross section, respectively, of the heat collector panel 502 internally having an amorphous photoelectric transducer 106. An outer frame 601 of the present heat collector panel 502 is provided with an open-air intake 101' for taking the open air into the panel, an indoor-air intake 102 for taking the air from the room, and an air flow outlet 107. One side of the outer frame 601 forms a window 604 so that sunlight 605 can be incident through it. The photoelectric transducer 106 is provided in the manner that it can be exposed to the incident light and divides into two portions the space defined by the outer frame. The photoelectric transducer 106 absorbs the sunlight 605 to generate heat, and transmits the heat to the air 607 on the non-light-receiving side. The air flowed in through the open-air intake 101' or the indoor-air intake 102 is heated by the photoelectric transducer 106 in the air flow path 103' to turn into hot air and is flowed out through the outlet 107. Here, the air on the light-receiving side is not utilized as the heating medium, because no sufficient heating function can be assured using only the window material and hence the air on the light-receiving side is used as a heat insulation material having a high thermal resistance. The apparatus used here may also have a fin structure so that the thermal resistance on the back side of the photoelectric transducer 106 can be made lower or its back may be made dark in color. This is effective for improving the conduction of heat.

The photoelectric transducer 106 generates electricity as a matter of course, and is so constituted that the electricity generated is taken out from the non-light-receiving side of the photoelectric transducer 106 and further taken outside though a cable connecter (not shown). This electric power may be used to drive the fan 105 so that the air circulation system can be self-driven without need of external power supply.

How to Drive

Figure 7B:
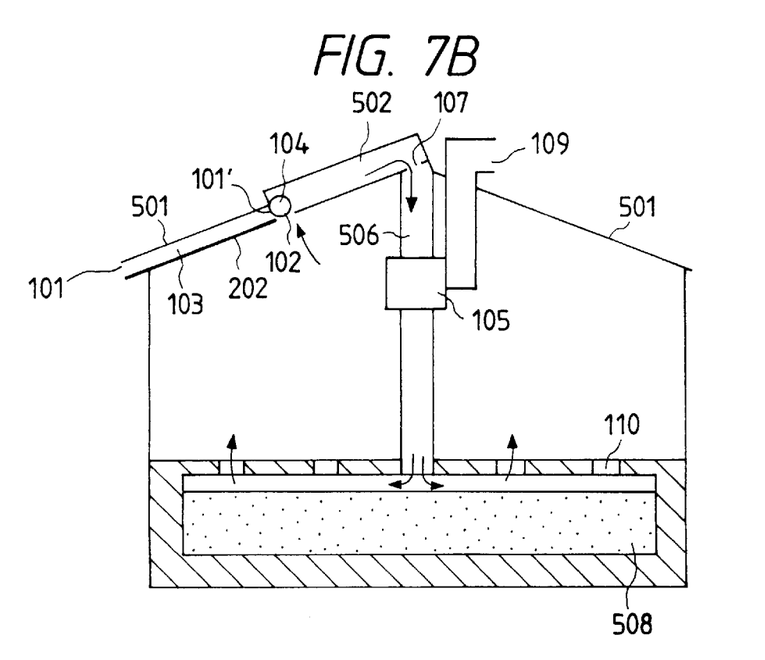
FIG. 7B illustrates how the air is circulated through the air circulation system of the present invention at night in winter.

FIGS. 7A and 7B illustrate courses through which the air flows through the passive solar system housing when the amount of solar radiation is large in winter. FIG. 7A illustrates a course in the daytime, and FIG. 7B a course at night. In the daytime in winter, the air having entered through the open-air intake 101 provided at the eaves is allowed to slowly flow toward the ridge of the roof through the air flow path 103 formed between the roof material 501 and the heat insulation material 202. In that course, the air is heated by the roof material 501 having come to have a high temperature by sunshine and the air comes to have a higher temperature. In general, the roof material 501 comes to have a temperature of 80 to 90° C. by sunshine, but the air in the air flow path 103 a temperature of 60° C. at most because the heat dissipates to the open air. Also, when it is windy, the heat may greatly dissipates however strong the sunshine is. Accordingly, in order to further raise the temperature of the air in the air flow path 103, the heat collector panel 502 is provided in the vicinity of the ridge. The air having come up through the air flow path 103 right beneath the roof is allowed to flow into this heat collector panel 502 through the open-air intake 101'. Then, the hot air of 80° C. or above, made hot in the air flow path 103 beneath the roof material 501 and in an air flow path 103' inside the heat collector panel 502, is drawn into the interior of a house by means of the fan 105, passes through the duct 506 and heats the concrete 508 provided under the floor, where the heat is stored so that the heat stored can be utilized through an indoor air blow outlet 110 when necessary.

At this stage, the photoelectric transducer provided in the heat collector panel 502 comes to have a high temperature of 80 to 100° C. Since, however, the amorphous semiconductor is tough to heat, the photoelectric transducer does not causes a great deterioration of characteristics.

Meanwhile, when the amount of solar radiation is small, e.g., at night, the valve 104 is switched to the indoor-air intake 102 side so that the hot air blown out of the indoor air blow outlet 110 is circulated, whereby the room can be kept warm and also the photoelectric transducer 106 can be prevented from undergoing radial cooling.

Figure 8A:
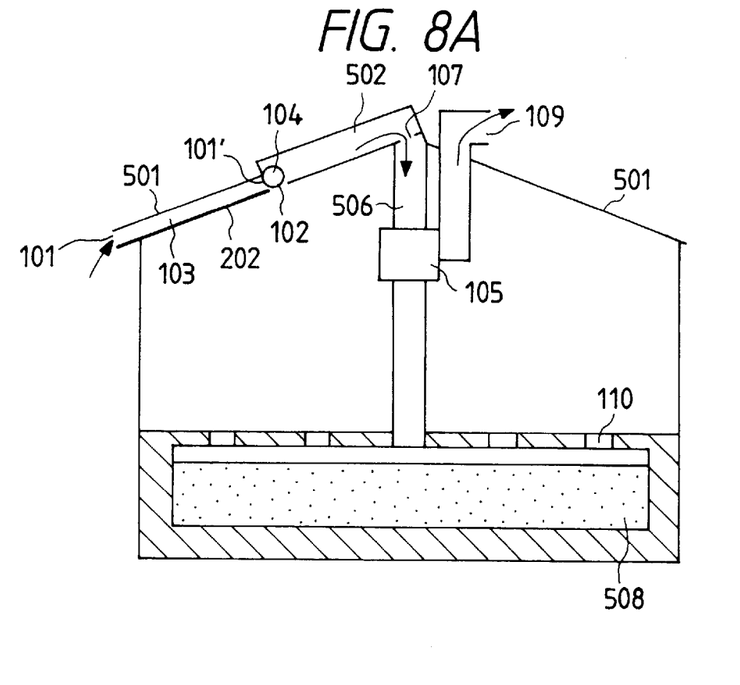
FIG. 8A illustrates how the air is circulated through the air circulation system of the present invention in the daytime in summer.
Figure 8B:
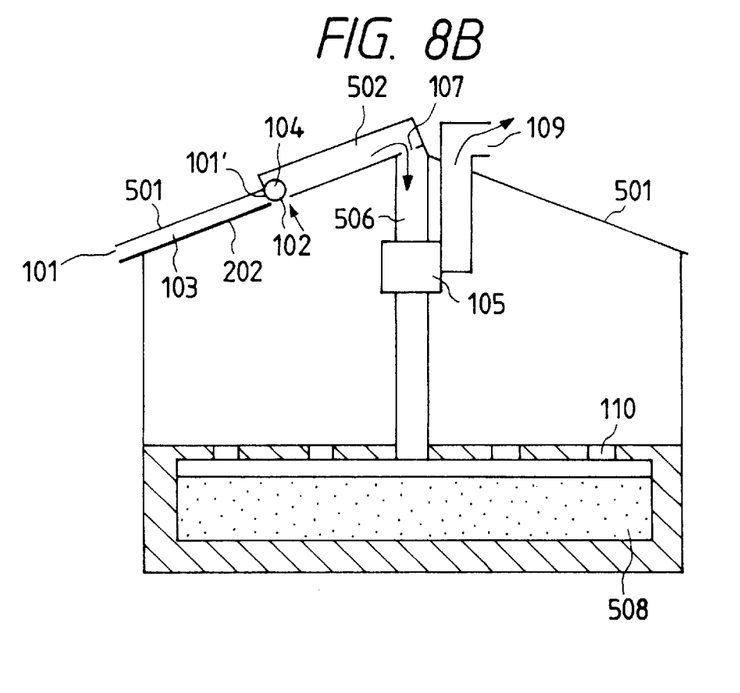
FIG. 8B illustrates how the air is circulated through the air circulation system of the present invention at night in summer.

FIGS. 8A and 8B illustrate courses through which the air flows through the passive solar system housing when the amount of solar radiation is large in summer. FIG. 8A illustrates a course in the daytime, and FIG. 8B a course at night. In the daytime in summer, the air having entered through the open-air intake 101 provided at the eaves is allowed to flow toward the ridge through the air flow path 103 formed between the roof material 501 and the heat insulation material 202. In that course, the air is heated by the roof material 501 having come to have a high temperature by sunshine, but the air little comes to have a higher temperature because the fan is driven at a high number of revolution. Then the air having come up through the air flow path 103 right beneath the roof is allowed to flow into the heat collector panel 502 through the open-air intake 101', cools the photoelectric transducer 106, is passed through the duct and is discharged outside through the air discharge outlet 109.

The system driven in this way enables control of excessive temperature rise of the photoelectric transducer. Also, the air layer flowing beneath the roof also functions as a heat insulation material that separates the heat of the roof material from the room.

Meanwhile, when the amount of solar radiation is small, e.g., at night, the valve 104 is switched to the indoor-air intake 102 side so that the indoor air may be flowed in, whereby the photoelectric transducer 106 can be prevented from undergoing radial cooling and also the heat filling the room can be discharged outside.

In the present embodiment, the housing space is used to keep the photoelectric transducer 106 hot at night. When, e.g., a room cooler is used at night in summer, it is also effective to connect the indoor-air intake 102 with the air flow outlet of an outdoor unit of the room cooler so that the air can be discharged outside through the photoelectric transducer 106 provided at the roof. It is also possible to maintain a much higher temperature if the waste heat of a heater or the heat of hot water of a bath is utilized.

Typical manners for controlling the courses of air in the daytime and at night in summer and winter have been described above. Since the atmospheric temperature and the amount of solar radiation in these seasons may differ depending on districts, the system may be driven, e.g., in the winter mode even in summer if it is cold. Stated additionally, it is also possible to make such control by automation using a temperature sensor.

Automatic Control

A typical manner of such control made by automation will also be described below with reference to FIG. 5.

Figure 5:
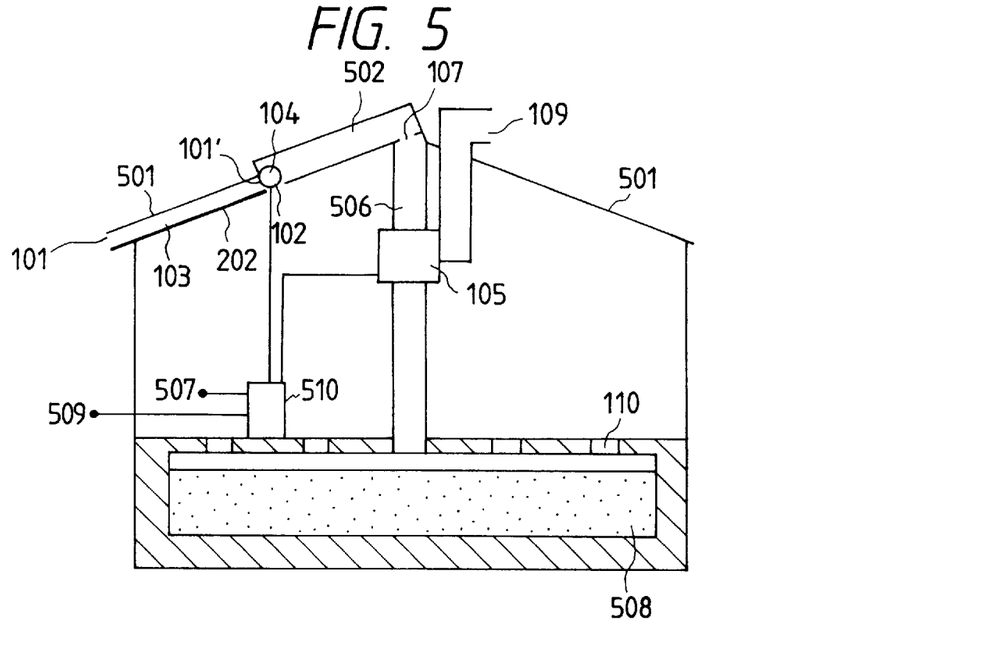
FIG. 5 illustrates an automatic-control air circulation system according to the present invention.

In FIG. 5, reference numerals 507 and 509 denote temperature sensors, where the sensor 507 monitors indoor temperature, and the sensor 509, outdoor temperature. The outdoor temperature is sensed by the outdoor temperature sensor 509, and the amount of solar radiation is sensed according to the amount of generated electricity or voltage of the photoelectric transducer provided in the heat collector panel. According to the results obtained, the daytime or night mode in summer and the daytime or night mode in winter are switched by means of a control unit 510. The temperature of the room and the temperature of the photoelectric transducer may also be sensed so that the timing of switching the heating medium at night can be detected in a good efficiency. Further, it is also possible to make control taking account of special circumstances such as use of cooling or heating of a room.

Assembly Components

A solar cell integrated type heat collector panel according to the present invention and units for air circulation will be described below in detail with reference to FIGS. 6A and 6B.

Solar Cell Module 106

Figure 9A:
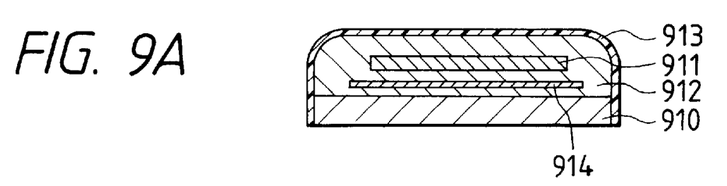
FIG. 9A is a cross section of a resin-sealed solar cell according to the present invention.

The solar cell module 106 comprises, as shown in FIG. 9A, a back reinforcing member 910, and provided thereon a back covering film 914 and a photoelectric transducer 911 sealed thereon with a filler 912, which are covered with a protective film 913.

1) Back Reinforcing Member (Back Plate):

The back reinforcing member 910 may be made of a material including metal plates of various types, in particular, insulated metals such as coated galvanized sheet iron, as well as carbon fiber, FRP (glass fiber reinforced plastics), ceramics, and glass.

Figure 9B:
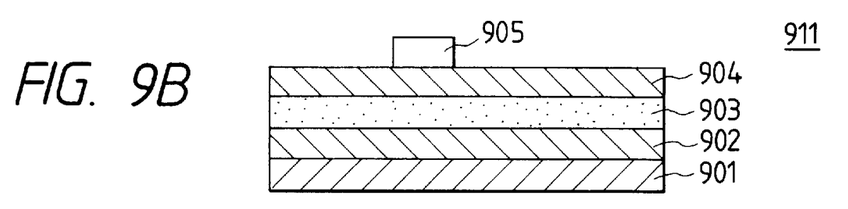
FIG. 9B is a cross section of a photoelectric transducer according to the present invention.

2) Photoelectric Transducer:

As the photoelectric transducer 911, an amorphous silicon solar cell may preferably be used, as having good characteristics at a high temperature. It may be constituted as shown in FIG. 9B as an example.

The solar cell 911 is constituted of a conductive substrate 901, a back reflective layer 902, a semiconductor layer 903, a transparent conductive layer 904 and a collector electrode 905.

The conductive substrate 901 may include a stainless steel sheet, an aluminum sheet, a copper sheet, a titanium sheet, a carbon sheet, galvanized sheet iron, and films of resins such as polyimide, polyester, polyethylene napthalide and epoxy resins or ceramic sheets such as a glass sheet, having conductive layers formed thereon.

As the back reflective layer 902, a metal layer, a metal oxide layer or a composite layer of a metal layer with a metal oxide layer may be used. As metal materials, titanium, chromium, molybdenum, tungsten, aluminum, silver, copper, nickel and the like may be used. As metal oxide materials, zinc oxide, titanium oxide, tin oxide and the like may be used.

The above metal layer and metal oxide layer may be formed by a process including resistance heating evaporation, electron beam evaporation, and sputtering.

The semiconductor layer 903 may have a pin structure using an amorphous or microcrystalline material such as Si, SiGe or SiC and formed by high-frequency plasma-assisted CVD or microwave plasma-assisted CVD. It may have the pin structure in plurality.

To form the transparent conductive layer 904, the metal oxide as described above may be used.

The collector electrode 905 may be formed by masked screen printing using a conductive paste, or fixing a metal wire such as copper wire using a conductive paste such as carbon paste.

3) Protective Film:

As materials for the protective film 913, fluorine resins such as polyethylene tetrafluoroethylene, polyethylene trifluoride and polyvinyl fluoride are preferably used because of their high weatherability. Fluorine resin films usually have a poor adhesion, and hence their surfaces for adhesion may be subjected to corona treatment or primer coating.

4) Back Covering Film (Back Film):

The back covering film 914 is necessary for ensuring the insulation between the photoelectric transducer and the back reinforcing member, and is therefore required to have insulating properties. Materials therefor include nylon and polyethylene terephthalate. The back covering film may also be formed by coating an insulating material on the back reinforcing member.

5) Filler:

As materials for the filler 912, resins such as EVA (ethylene-vinyl acetate copolymer), EEA (ethylene acrylate copolymer), butyral resin, silicone resin and epoxy resin may be used. The filler may have a glass nonwoven fabric sheet in order to improve scratch resistance. It may also contain an ultraviolet light absorber that absorbs ultraviolet rays.

Outer Frame 601

The outer frame 601 may preferably be made of a structural material having high heat insulation properties. For example, wood, polystyrene, calcium silicate, foamed styrol or composite materials of any of these may be used. In the present example, a structural material having a thickness of at least 20 mm may be used so that the outer frame can have a highly heat insulating function. This outer frame may have such a size that it extends from the eaves to the ridges, or as shown in FIG. 5 it may be provided so as to form a part of the pitch of the roof. It may also be formed of outer frames connected in plurality.

Window 604

The window may preferably be made of a material having high light transmission properties and high heat insulation properties. For example, glass, polycarbonate, polyethylene terephthalate, acrylic resin, nylon or the like may be used. The window may be attached to the outer frame 601 by the use of an adhesive such as a rubber adhesive, a silicone adhesive or an acrylic adhesive. An edge cover may also be optionally provided. In the present example, a glass of 3 mm thick is used and a heat insulating airtight space of at least 30 mm thick is provided between the photoelectric transducer and the glass.

Open-Air Intake 101, 101', Indoor-Air Intake 102

These have a structure through which the air can be flowed in. A filter for preventing dust or the like from entering or a chemical filter for blocking acidic substances contained in the air may also be provided. The open-air intake 101' and the indoor-air intake 102 are provided adjacently, and have a valve for switching the air to flow outdoors or flow indoors. A throttle may also be provided so that the flow rate of the air can be controlled.

Air Flow Outlet 107

This has a structure through which the air or water can be discharged outside. A filter for preventing dust or the like from entering or a chemical filter for blocking acidic substances contained in the air may also be provided. A throttle may also be provided so that the flow rate of air can be controlled.

Roof Material 501

As metallic materials having good corrosion resistance and good processing resistance, galvanized sheet iron or the like may be used. Such metallic materials may be bent using a roller former or the like and can be readily used. Alternatively, the roof material may be formed using a plastic material such as vinyl chloride or a ceramic material.

Heat Insulation Material 202

A heat insulation material inserted between the roof material and the room may commonly include grass wool and foamed plastic.

Duct 506

The duct 506 is a pipe through which the air heated in the heat collector panel 502 is sent to a heat storage member provided under the floor. Its inside is formed of a galvanized sheet iron and its periphery is set up using a highly insulating material, e.g., glass wool or foamed plastic so that the heat can be prevented from leaking.

Fan 105

The fan 105 is a means for releasing to the outside the air heated in the heat collector panel 502 or driving it forward through the duct 506 to the heat storage member provided under the floor. An AC motor is usually used therefor in view of the readiness of maintenance. A DC motor may be used for a fan when the fan is not systematically connected.

At the rear of this fan, a valve (not shown) for setting the course of air circulation is attached so that the indoor circulation of air can be controlled together with the valve 104 provided in the heat collector panel 502.

Heat Storage Member 508

This may be any of those having a large heat capacity so long as it forms a heat storage member that can store the heat produced in the daytime and emit it at night. In practice, concrete is widely used from the viewpoint of cost, as being inexpensive. As the shape of the concrete at the heat storage portion, a solid type is widely used. Its surface shape may be changed to make the surface area larger so that the heat can be absorbed and emitted at a higher efficiency. Alternatively, stone, brick, water or the like may be used.

EXAMPLES

To confirm the effect of temperature keeping according to the present invention, test houses were constructed in Kyoto, Japan, according to the first and second embodiments described above, which were tested as Examples 1 and 2, respectively. As a comparative example, a module of an amorphous photoelectric transducer sealed with EVA or the like and having a like performance was installed on the ground. The temperature of the photoelectric transducer in each system was recorded.

Changes in temperature with the passage of time in summer and winter are shown in Tables 2 and 3, respectively. In Examples 1 and 2, cooling equipments such as room coolers are not used in summer. In Example 1, a room heater is used in winter. In Example 2, a room heater is not used in winter. In Tables 2 and 3, "*" indicates a daytime mode.

As is seen from Table 2 and 3, Examples of the present invention show a superiority in temperature keeping.

TABLE 1

| Hours | (Open-air temp.) (° C.) | Module without heat insulation material (° C.) | Module with heat insulation material (° C.) |
|---|---|---|---|
| 4:00 | (27) | 26 | 23 |
| 8:00 | (29) | 49 | 55 |
| 12:00 | (36) | 64 | 84 |
| 16:00 | (35) | 47 | 65 |
| 20:00 | (31) | 30 | 30 |
| 24:00 | (29) | 28 | 26 |

TABLE 2

| Hours | (Open-air temp.) (° C.) | Example 1 (° C.) | Example 2 (° C.) | Comparative Example (° C.) |
|---|---|---|---|---|
| 4:00 | (24.1) | 28.1 | 29.3 | 22.4 |
| 8:00 | (30.3)* | 48.3 | 47.4 | 41.9 |
| 12:00 | (36.3)* | 82.3 | 81.5 | 59.8 |
| 16:00 | (35.9)* | 59.5 | 58.9 | 44.1 |
| 20:00 | (28.8) | 32.3 | 33.5 | 26.0 |
| 24:00 | (25.4) | 29.6 | 30.6 | 23.3 |

TABLE 3

| Hours | (Open-air temp.) (° C.) | Example 1 (° C.) | Example 2 (° C.) | Comparative Example (° C.) |
|---|---|---|---|---|
| 4:00 | (−2.4) | 17.3 | 13.2 | −4.7 |
| 8:00 | (0.9) | 45.6 | 43.8 | 5.3 |
| 12:00 | (9.1)* | 95.8 | 92.8 | 32.0 |
| 16:00 | (6.8)* | 56.1 | 60.5 | 11.7 |
| 20:00 | (−0.2) | 18.9 | 17.3 | −4.5 |
| 24:00 | (−2.6) | 18.5 | 14.4 | −6.2 |

What is claimed is:

1. A sunlight energy conversion apparatus comprising a photoelectric transducer comprising a non-single crystal semiconductor and an air flow path provided on the back of said photoelectric transducer and having a plurality of selectable air intakes.

2. The sunlight energy conversion apparatus according to claim 1, wherein at least one of said plurality of air intakes communicates with the inside of a house and at least another one of said plurality of air intakes communicates with the outside of the house.

3. The sunlight energy conversion apparatus according to claim 2, further comprising a valve for selecting at least one of said plurality of air intakes.

4. The sunlight energy conversion apparatus according to claim 3, further comprising control unit for switching the valve depending on the amount of solar radiation.

5. The sunlight energy conversion apparatus according to claim 3, fruther comprising a control unit for switching the valve depending on the temperature of a room and/or the temperature of said photoelectric transducer.

6. The sunlight energy conversion apparatus according to claim 1, wherein the air flow path is formed by an outer frame and said photoelectric transducer provided in the outer frame so as to divide into two portions an inner space defined by the outer frame.

7. The sunlight energy conversion apparatus according to claim 6, wherein the outer frame is formed of a heat insulation material.

8. The sunlight energy conversion apparatus according to claim 6, wherein the outer frame has a light-transmitting material on its light-incident side.

9. The sunlight energy conversion apparatus according to claim 1, wherein said photoelectric transducer is sealed with a resin on a reinforcing member and is covered with a protective film.

10. The sunlight energy conversion apparatus according to claim 9, wherein the reinforcing member comprises a metallic plate.

11. The sunlight energy conversion apparatus according to claim 9, wherein the reinforcing member has a dark-colored surface.

12. The sunlight energy conversion apparatus according to claim 9, wherein the reinforcing member has a radiating fin on the back thereof.

13. The sunlight energy conversion apparatus according to claim 1, further comprising a fan for causing air to flow.

14. The sunlight energy conversion apparatus according to claim 13, wherein the fan is supplied with electric power generated by said photoelectric transducer.

15. The sunlight energy conversion apparatus according to claim 1, further comprising means for supplying heat comprising a heat storage member.

16. The sunlight energy conversion apparatus according to claim 15, wherein the heat storage member comprises concrete, stone, brick, or water.

17. A method of controlling the temperature of a photoelectric transducer, which comprises allowing air to flow through an air flow path provided on the back of the photoelectric transducer comprising a non-single crystal semiconductor to control the temperature of said photoelectric transducer.

18. The method according to claim 17, wherein the air is selected at least from air taken in from inside of a house and air taken in from outside of the house.

19. The method according to claim 18, wherein the air taken in from the outside of the house is allowed to pass through the air flow path and thereafter is taken into the inside of the house.

20. The method according to claim 18, wherein the air taken in from the outside of the house is allowed to pass through the air flow path and thereafter reaches a heat storage member.

21. The method according to claim 20, wherein the heat storage member comprises concrete, stone, brick, or water.

22. The method according to claim 18, wherein the air taken in from the outside of the house is allowed to pass through the air flow path and thereafter is discharged to the outside of the house.

23. The method according to claim 18, wherein the air taken in from the inside of a house is allowed to pass through the air flow path and thereafter again circulate through the inside of the house.

24. The method according to claim 18, wherein the air taken in from the inside of a house is allowed to pass through the air flow path and is thereafter discharged to the outside of the house.

25. The method according to claim 17, wherein the air is caused to flow by means of a fan.

26. The method according to claim 25, wherein the fan is supplied with electric power generated by said photoelectric transducer.

27. The method according to claim 17, wherein a waste heat of a heat exchanger is utilized to control the temperature.

28. The method according to claim 17, wherein the air is taken in from the outside of a house when the amount of solar radiation is large and the air is taken in from the inside of the house when the amount of solar radiation is small.

29. An air circulation system comprising a heat collector panel comprising an open-air intake, an indoor-air intake, valve for selecting either the open-air intake or the indoor-air intake, an air flow path, an air outlet, and a solar cell, a first duct through which the air taken out of the air outlet is guided indoors, a second duct through which the air taken out of the air outlet is discharged outdoors, a valve for selecting either the first duct or the second duct, and a fan for allowing the air taken through the air outlet to flow.

30. The air circulation system according to claim 29, wherein the air is taken in from the outside of a house when the amount of solar radiation is large and is taken in from the inside of the house when the amount of solar radiation is small.

31. The air circulation system according to claim 29, wherein the air taken in from the outside of a house is allowed to pass through the air flow path and thereafter reaches a heat storage member.

32. The air circulation system according to claim 31, wherein the heat storage member comprises concrete, stone, brick, or water.

33. The air circulation system according to claim 29, wherein the air taken in from the outside of a house is allowed to pass through the air flow path and is thereafter guided to the inside of the house.

34. The air circulation system according to claim 29, wherein the air taken in from the outside of a house is allowed to pass through the air flow path and is thereafter discharged to the outside of the house.

35. The air circulation system according to claim 29, wherein the air taken in from the inside of a house is allowed to pass through the air flow path and is thereafter again circulated through the inside of the house.

36. The air circulation system according to claim 29, wherein the air taken in from the inside of the house is allowed to pass through the air flow path and is thereafter discharged to the outside of the house.

37. The air circulation system according to claim 29, wherein said valve for selecting either the first duct or the second duct is switched depending on the amount of solar radiation, the temperature of said photoelectric transducer, the open-air temperature or the temperature of a room.

38. A sunlight energy conversion apparatus comprising an amorphous photoelectric transducer; and a flow path formed by a space provided on a side opposite to a light incidence side of the photoelectric transducer, for providing a heating medium with the thermal energy of the sunlight irradiated to the photoelectric transducer and having a plurality of selectable inlets and an outlet for inflow/outflow of the heating medium.

39. A method of controlling the temperature of a photoelectric transducer which comprises:
  (a) selecting either open-air or indoor-air based on the temperature of a photoelectric transducer, the outdoor temperature, the indoor temperature, and the amount of solar radiation; and
  (b) allowing the selected air to flow into said photoelectric transducer to control the temperature of said photoelectric transducer.

40. The method according to claim 39, including determining amount of solar radiation based on the amount of electricity or voltage generated by said photoelectric transducer.

* * * * *